(12) United States Patent
Lüchinger et al.

(10) Patent No.: US 11,737,337 B1
(45) Date of Patent: Aug. 22, 2023

(54) COLOR CONVERSION FILM WITH SEPARATION LAYER

(71) Applicant: Avantama AG, Stäfa (CH)

(72) Inventors: Norman Albert Lüchinger, Meilen (CH); Davide Toniolo, Hombrechtikon (CH); Franziska Krieg, Rüti (CH)

(73) Assignee: Avantama AG, Stäfa (CH)

( * ) Notice: Subject to any disclaimer, the term of this patent is extended or adjusted under 35 U.S.C. 154(b) by 0 days.

(21) Appl. No.: 18/133,626

(22) Filed: Apr. 12, 2023

(30) Foreign Application Priority Data

Oct. 27, 2022 (EP) .................................... 22204185

(51) Int. Cl.
| | |
|---|---|
| G02F 1/133 | (2006.01) |
| H10K 59/38 | (2023.01) |
| G02F 1/1335 | (2006.01) |
| H10K 85/50 | (2023.01) |
| C09K 11/54 | (2006.01) |
| C09K 11/02 | (2006.01) |
| C09K 11/70 | (2006.01) |
| C09K 11/06 | (2006.01) |

(52) U.S. Cl.
CPC .............. *H10K 59/38* (2023.02); *C09K 11/02* (2013.01); *C09K 11/06* (2013.01); *C09K 11/54* (2013.01); *C09K 11/70* (2013.01); *G02F 1/133614* (2021.01); *H10K 85/50* (2023.02)

(58) Field of Classification Search
CPC .. H10K 59/38; H10K 85/50; G02F 1/133614; C09K 11/06; C09K 11/02
USPC ........................................................... 362/84
See application file for complete search history.

(56) References Cited

U.S. PATENT DOCUMENTS

| | | |
|---|---|---|
| 10,294,420 B2 | 5/2019 | Lüchinger et al. |
| 11,008,508 B2 | 5/2021 | Lüchinger et al. |
| 2021/0332292 A1* | 10/2021 | Hu .................... H10K 50/125 |

FOREIGN PATENT DOCUMENTS

| | | | |
|---|---|---|---|
| CN | 113568222 A | * | 10/2021 |
| WO | 2016168048 A1 | | 10/2016 |
| WO | 2021081380 A1 | | 4/2021 |

OTHER PUBLICATIONS

Extended European Search Report for corresponding European Application 22204185.7 dated Apr. 5, 2023.

* cited by examiner

*Primary Examiner* — Christopher M Raabe
(74) *Attorney, Agent, or Firm* — Renner, Otto, Boisseile & Sklar, LLP

(57) ABSTRACT

The invention discloses color conversion film which, upon ex-citation by blue light, emits green and red light. The films comprise at least one red light emitting layer, one green light emitting layer and sandwiched in between at least one separation layer.

18 Claims, No Drawings

COLOR CONVERSION FILM WITH SEPARATION LAYER

This application claims priority to European Patent Application No. 22204185.7, filed Oct. 27, 2022, which is hereby incorporated herein by reference in its entirety.

TECHNICAL FIELD

The invention relates to a color conversion film comprising a layer of green perovskite crystals and a layer of red core-shell quantum dots and specific separation layers to thereby separate these layers. The invention further provides for methods to manufacture such films as well as devices comprising such films.

BACKGROUND ART

State-of-the-art liquid crystal displays (LCD) or display components comprise luminescent crystal (quantum dot) based components. In particular, a backlight component of such a LCD might comprise a RGB backlight consisting of a red, a blue and a green light. Today, typically luminescent crystals (quantum dots) are used to produce the backlight colours of such a backlight component.

For example, WO2017/108568 discloses luminescent components suitable for manufacturing LCDs. The luminescent components comprise green light emitting perovskites dispersed in a polymer film and red light emitting perovskites dispersed in a further polymer film. Although suitable, these luminescent components show comparatively high levels of heavy metals. Further, EP22179215.3 (unpublished) discloses a luminescent component suitable for manufacturing LCDs. The luminescent components comprise green light emitting perovskites dispersed in a polymer film and red light emitting core-shell quantum dots dispersed in a further polymer film, both films being separated by an inorganic layer.

The manufacturing of such components faces various challenges. One challenge is the embedding of the luminescent crystals into the component. Due to the different chemical properties of the luminescent crystals, there might be incompatibilities between the various embedded materials comprising the luminescent crystals or even between luminescent crystals embedded within the same material. Such incompatibilities might lead to degradation of the materials in the display components and therefore the lifetime of such a display might be affected.

In addition, luminescent crystal based components often deal with challenges regarding degradation by humidity and or oxygen. Luminescent perovskite crystals predominantly degrade by the presence of humidity/water and luminescent core-shell quantum dots predominantly degrade the presence of oxygen. It is difficult to achieve display components comprising green luminescent perovskite crystals and red luminescent core-shell quantum dots with sufficient stability against both humidity and oxygen.

Still further, luminescent components should meet legal provisions, such as RoHS Directive. Of particular concern is the compliance with low content of heavy metals in such components and the simultaneous market requirement of high luminescence. Luminescent perovskite crystals contain Pb which is a heavy metal and restricted under the RoHS directive. Therefore it is a goal to minimize the quantity of luminescent perovskite crystals per display.

DISCLOSURE OF THE INVENTION

The problem to be solved by the present invention is to overcome the disadvantages of the prior art. In particular, the present invention overcomes the disadvantages of the prior art in terms of stability. The invention relates to color conversion film which, upon ex-citation by blue light, emits green and red light. The films comprise at least one red light emitting layer, one green light emitting layer and sandwiched in between at least one separation layer. Unless otherwise stated, the following definitions shall apply in this specification:

The terms "a", "an" "the" and similar terms used in the context of the present invention are to be construed to cover both the singular and plural unless otherwise indicated herein or clearly contradicted by the context. The term "containing" shall include all, "comprising", "essentially consisting of" and "consisting of". Percentages are given as weight-%, unless otherwise indicated herein or clearly contradicted by the context. "Independently" means that one substituent/ion may be selected from one of the named substituents/ions or may be a combination of more than one of the above.

The term "luminescent crystal" (LC) is known in the field and in the context of the present invention relates to crystals of 2-100 nm, made of semiconductor materials. The term comprises quantum dots, typically in the range of 2 nm and nanocrystals, typically in the range of 10-100 nm.

LCs show, as the term indicates, luminescence. In the context of the present invention the term luminescent crystal includes both, single crystals and polycrystalline particles. In the latter case, one particle may be composed of several crystal domains (grains), connected by crystalline or amorphous phase boundaries. A luminescent crystal is a semiconducting material which exhibits a direct bandgap (typically in the range 1.1-3.8 eV, more typically 1.4 3.5 eV, even more typically 1.7-3.2 eV). Upon illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence.

The term "quantum dot" (QD) is known and particularly relates to semiconductor nanocrystals, which have a diameter typically between 2-10 nm. In this range, the physical radius of the QD is smaller than the bulk ex-citation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific subgroup of nanocrystals, defined in particular by its size and size distribution. Typical quantum dot compositions comprise Cadmium or Indium, for example in the form of Cadmium Selenide (CdSe) Indium Phosphide (InP).

The term "core-shell quantum dots" is known and particularly relates to quantum dots typically containing an Indium comprising or Cadmium comprising core, typically having a CdSe core or InP core having an additional shell typically comprising Zinc Sulfide (ZnS), Zinc Selenide (ZnSe), Cadmium Sulfide (CdS) or combinations thereof. Core-shell quantum dots may comprise multiple shells or shell gradients.

The term "perovskite crystals" is known and particularly includes crystalline compounds of the perovskite structure. Such perovskite structures are known per se and described as cubic, pseudocubic, tetragonal or or -thorhombic crystals of general formula $M^1M^2X_3$, where $M^1$ are cations of coordination number 12 (cuboctaeder) and $M^2$ are cations of coordination number 6 (octaeder) and X are anions in cubic, pseudocubic, tetragonal or orthorhombic positions of the lattice. In these structures, selected cations or anions may be replaced by other ions (stochastic or regularly up to 30 atom-%), thereby resulting in doped perovskites or nonstochiometric perovskites, still maintaining its original crystalline structure. Preferably, luminescent perovskite crystals are approximately isometric (such as spherical or cubic). Particles are considered approximately isometric, in case the aspect ratio (longest:shortest direction) of all 3 orthogonal dimensions is 1-2. Accordingly, an assembly of LCs preferably contains 50-100% (n/n), preferably 66-100% (n/n) much preferably 75 100% (n/n) isometric nanocrystals.

The manufacturing of such luminescent perovskite crystals is known, e.g. from WO2018/028869.

The term "polymer" is known and includes synthetic materials comprising repeating units ("monomers"). The term polymers includes homo-polymers and co-polymers. Further, cross-linked polymers and non-cross-linked polymers are included. Depending on the context, the term polymer shall include its monomers and oligomers. Polymers include, by way of example, acrylate polymers, carbonate polymers, sulfone polymers, epoxy polymers, vinyl polymers, urethane polymers, imide polymers, ester polymers, furane polymers, melamine polymers, styrene polymers, olefin polymers (including cyclic olefin polymers such as norbornene polymers), and silazane polymers. Polymers may include, as conventional in the field, other materials such as polymerization initiators, stabilizers, and fillers.

The term "matrix" is known in the field and in the context of this invention denotes continuous phase encompassing a discontinuous or particulate phase. The continuous material thereby encapsulating the particulate phase.

A first aspect of the invention refers to a color conversion film which, upon excitation by blue light, emits green and red light. Inventive films comprise a multitude of layers, whereby one or more layers (preferably one layer) is a green light emitting polymer layer comprising green light emitting perovskite crystals; and one or more layers (preferably one layer) is a red light emitting polymer layer comprising red light emitting core-shell quantum dots comprising II-VI or II-V-type semiconductors; and whereby the red and green light emitting polymer layer(s) is (are) separated by one or more separating layers. Suitable separating layers cover the whole area of the red and/or the green light emitting polymer layer(s). Further, the color conversion film may comprise one or more barrier films attached to the red light emitting polymer layer(s) and/or to the green light red emitting polymer layer(s). Further, the color conversion film may comprise one or more non-emissive polymer layer(s). Further, the red light emitting polymer layer may comprise one or more polythiols. It was found that the these color conversion films, combining Perovskites and Core-Shell QDs in one laminated structure, show excellent optical properties, combined with low content of heavy metals, high stability against temperature, humidity and oxygen, and further at the benefit of low manufacturing costs. This aspect of the invention shall be explained in further detail below.

Color Conversion Film:

Color conversion films are known per se and find wide application in commercial items such as displays. According to this invention, such films partially or fully convert blue light into red and green light. Typically, the blue light is converted partially, resulting in emission of light in the blue, the green and the read spectrum. Upon adjusting intensity of blue light, and concentration, film thickness and amount of luminescent green and red material, the color of the emitted light may be adjusted in line with customer's needs.

Such color conversion films may be described as laminated structure and identified by its individual layers, such as "red light emitting polymer layer", "green light emitting polymer layer", "separating layer", and "covering layer".

Color conversion films typically have a film thickness, including all individual layers, of 10-500 micrometers, preferably 20-250, most preferably 30-200 micrometers.

Color conversion films of this invention may be assembled to obtain a display backlight component. Accordingly, the invention also provides for a display backlight component comprising a color conversion film as described herein.

Color conversion films of this invention may be assembled to obtain a light emitting device, such as a liquid crystal display. Accordingly, the invention also provides for a light emitting device, preferably a Liquid crystal display, comprising a color conversion film as described herein.

Separating Layer:

Separating layers are implemented in the inventive color conversion films. As the name implies, they allow to spatially separate two layers. Suitable separating layers may be prepared using commercial starting materials and equipment. It was found that a separating layer sandwiched between red and green light emitting layer retains optical properties and improves the stability/reliability of the color conversion film; specifically edge ingress of the red light emitting layer is improved (reduced).

In the context of this invention, a separating layer fully, or essentially fully, covers one surface of a first light emitting polymer layer. It is known in the field that film production that sections on the border of a laminated structure are not coated with functional layers to thereby allow or facilitate production ("spare area"). Even if such non-coated areas are present, the skilled person will understand that the laminated structure (i.e. the color conversion film) is fully covered by a separating layer except for spare area. Such spare area is typically below 5% of the total area of a laminated structure In the context of this invention, a separating layer is arranged between a first and a second light emitting polymer layer. Separating layer and light emitting polymer layers may be in direct contact or may be spaced apart by one or more non-emissive polymer layers.

In the context of this invention, a separating layer is a continuous layer. As the term continuous implies, the layer is non-porous and free of defects.

In an advantageous embodiment, the separating layer provides properties of a humidity barrier. In embodiments, the separating layer has a water vapor transmission rate (WVTR) of less than 10 g/m2*day, preferably less than 1 g/m2*day, most preferably less than 0.1 g/m2*day. WVTR may be determined by ISO 15106-3:2003 at a temperature/relative humidity of 40° C./90% r.h.

In an advantageous embodiment, the separating layer provides properties of an oxygen barrier. In embodiments, the oxygen transmission rate (OTR) is less than 100 cm$^3$/m$^2$*day, preferably less than 10 cm$^3$/m$^2$*day, more preferably less than 1 cm$^3$/m$^2$*day, most preferably less than 0.1 cm³/m²*day. OTR determined by ISO15105 at a temperature of 23° C./90% r.h. and atmospheric pressure.

In embodiments, the separating layer contains, i.e. comprises or consists of a third polymer. Suitable organic materials may be selected from the group of polymers. Suitable polymers may be selected from the list of Polyesters, Poly(meth)acrylates, Polystyrenes, Polyolefins, Epoxies, Polyurethanes, Polyethylene-vinyl-alcohols (EVOH), Polyvinylidenchloride (PVDC), Polyvinylidene-fluoride (PVDF), Polyamides (PA), Polyacrylonitrile (PAN), Polysulfone (PSU), Polyethersulfone (PESU). Preferably, the third polymer is selected from Polyesters (such as PET), and/or ethylene-vinyl-alcohol polymers. Typically, the thickness of organic separating layers is between 1 micrometer to 200 micrometers, preferably between 3 micrometer to 100 micrometer, more preferably between 10 micrometer to 50 micrometer. Such separating layers are easy to process, as they are compatible with equipment used in industry and are also attractive from a commercial perspective.

In embodiments, the separating layer comprises sulfur, preferably in the form of thiol functional groups and/or thioether functional groups.

In embodiments, the separating layer contains, preferably consists of, a film laminate whereby a film of ethylenevinyl-alcohol polymer is sandwiched between two or more other films of a different polymer. Such films are commercially available e.g. for food-packaging and provide good oxygen barrier properties. In exemplary embodiments, film laminate structures containing an EVOH polymer are selected from the following list:

PE (polyethylene)/EVOH/PE,
PA/EVOH/PE,
PE/PA/EVOH/PA/PE,
OPET (oriented PET)/PE/EVOH/PE,
PS (polystyrene)/EVOH/PE,
PP (polypropylene)/EVOH/PE,
PET/EVOH/PE,
PP/EVOH/PP,
PC (polycarbonate)/EVOH/PP, and
PET/EVOH/PET.

In an alternative embodiment, the separating layer contains, preferably consists of, inorganic material. Suitable inorganic materials may be selected from the group consisting of metal oxides, metal nitrides, silicon oxides and silicon nitrides. Suitable inorganic materials include, without limitation, $SiO_x$ (x=1.7-2.3), $AlO_x$ (x=1.3-1.7), and $Si_xN_y$ (x=3 and y=3.5-4.5). Typically, the thickness of inorganic separating layers is between 1 nm to 10 micrometers, preferably 10 nm to 1 micrometer. Typically, the thickness of such inorganic layer is above 10 nanometers. Such inorganic separating layers, show gas barrier properties, particularly towards oxygen and water vapour, even at very thin film thickness.

It was found that optical properties are not negatively influenced by including one or more of the separating layers as discussed herein. Rather, film stability is improved and beneficial optical properties are retained.

First and Second Set of Covering Layers:

Adjacent to the light emitting polymer layer(s), covering layers may be present. A first and second set of covering layers each independently may comprise a single layer or a multitude of layers whereby such layers maybe inorganic or polymeric and are non-emissive (meaning they do not emit light when excited by blue light). Covering layers may have different functions and may be selected from:

Barrier films/layers
Intermediate films/layers
Adhesive films/layers
Light management films/layers
Non-emissive polymer films/layers Barrier Films/Layers:

In the context of the present invention, barrier films exhibit a low permeation rate for oxygen and/or humidity. Such barrier films may be selected from inorganic barrier films or polymeric barrier films having an oxygen transmission rate (OTR) of less than 10 cm3/m2*day, preferably less than 1 cm3/m2*day, most preferably less than 0.1 cm3/m2*day. OTR determined by ISO15105 at a temperature of 23° C./90% r.h. and atmospheric pressure and/or having a water vapor transmission rate (WVTR) of less than 10 g/m2*day, preferably less than 1 g/m2*day, most preferably less than 0.1 g/m2*day. WVTR may be determined by ISO 15106-3:2003 at a temperature/relative humidity of 40° C./90% r.h.

Inorganic barrier films comprise or consist of a continuous layer of inorganic material. Typically the thickness of such layer is 1 nm-10 micrometers, preferably 10 nm-1 micrometer. Suitable inorganic materials include, without limitation, $SiO_x$ (x=1.7-2.3), $AlO_x$ (x=1.3-1.7), and $Si_xN_y$ (x=3 and y=3.5-4.5).

Polymeric barrier films consist of a polymer or polymer blend and have a typical thickness of 5-200 micrometers, preferably 10-100 micrometers, most preferably 20-50 micrometers.

Inorganic and polymeric barrier films may be commercial items and may be supported by an additional polymer substrate.

Intermediate Films/Layers:

Intermediate layers can be implemented in color conversion films to further improve the stability of color conversion materials (typically of perovskite crystals), to separate specific layers to avoid contact of such specific layers or to facilitate the manufacturing of the color conversion film thus e.g. lowering manufacturing costs.

Intermediate layers comprise or consist of polymers. Suitable polymers are selected from the list of acrylate or methacrylate polymer, epoxy polymer, silazane polymer, cyclic olefin copolymer, polyester, preferably acrylate polymer or methacrylate polymer.

In embodiments such polymers are crosslinked.

Intermediate layers have a thickness of 5-100 micrometers, preferably 10-80 micrometers, most preferably 20 60 micrometers.

Adhesive Films/Layers:

Such layers are known in the field and may be included in the color conversion film to improve compatibility between layers, or to improve adhesion between layers, or to facilitate manufacturing.

Typically such layers are used on barrier films to improve the adhesion of adjacent polymeric layers such as intermediate layers or light emitting polymer layers.

Such layers have a typical thickness of 0.1-20 micrometers, preferably 0.5-10 micrometers, most preferably 1 micrometers.

In embodiments such layers consist of a polymer or polymer blend.

Typical polymers are selected from the list of acrylate or methacrylate polymers, epoxy polymers, urethane polymers.

Light Management Films/Layers:

Light management films/layers are sometimes used in color conversion films to e.g. increase the light output of color conversion films or reflect a specific portion of light.

Light management films include prism sheets, brightness enhancement films, micro lens array (MLA) films (such films are e.g. supplied by Brightview Technologies), blue light pass filter films (also called dichroic mirror films; such films transmit blue light and reflect green and red light; such films are supplied by 3M and are used in the Apple iPad Pro XDR from 2021).

MLA films typically have a thickness of 10-50 micrometer. Dichroic mirror films typically have a thickness of 20 100 micrometers.

Green Light Emitting Polymer Layer:

This layer comprises green light emitting luminescent perovskite crystals embedded in a matrix comprising or consisting of a first polymer.

Perovskites: The green luminescent crystals are perovskite crystals selected from compounds of formula (I):

$$[M^1A^1]_aM^2_bX_c \qquad (I),$$

wherein:

$A^1$ represents one or more organic cations, in particular formamidinium (FA), $M^1$ represents one or more alkaline metals, in particular Cs, $M^2$ represents one or more metals other than $M^1$, in particular Pb, X represents one or more anions selected from the group consisting of halides, pseudohalides and sulfides, in particular Br, a represents 1-4, b represents 1-2, c represents 3-9, and wherein either $M^1$, or $A^1$, or $M^1$ and $A^1$ being present.

In a further advantageous embodiment of the invention the green luminescent crystals are green luminescent perovskite crystals of formula (I'):

$$FAPbBr_3 \qquad (I')$$

In particular, formula (I) describes perovskite luminescent crystals, which, upon absorption of blue light, emit light of a wavelength in the green light spectrum between 500 nm and 550 nm, in particular centered around 525 535 nm.

First Polymer: A wide range of polymers are suitable and may be selected by routine experiments. Particularly suitable first polymers may be selected from the group of acrylates and methacrylates. The first polymer forms a matrix for the perovskite crystals of formula (I).

Red Light Emitting Polymer Layer:

This layer comprises red light emitting core-shell quantum dots embedded in a matrix comprising or consisting of a second polymer. The layer may additionally comprise one or more sulphur containing compounds (II), as outlined below.

Red QDs: Red core-shell quantum dots are known, such quantum dots emit red light (630 nm+/−30 nm) in response to excitation by light of a shorter wavelength. Suitable crystals are selected from the group of II-VI semiconductor compounds (i.e. containing a metal $M^3$ with stable oxidation state +2, such as Zn, Cd) and from the group of III-V semiconductor compounds. (i.e. containing a metal $M^{3'}$ with stable oxidation state +3, such as Y).

In preferred embodiments, red emitting core-shell quantum dots are having a core comprising Indium or Cadmium, most preferably Indium.

In another preferred embodiment, red emitting core-shell quantum dots are having a core comprising Indium phosphide or Cadmium selenide, most preferably Indium phosphide.

The crystal size of the red core-shell quantum dots may vary over a broad range, but typically within 1-10 nm. Such crystals are referred as Quantum dots, thereby distinguishing from microcrystals. For II-VI semiconductor compounds, suitable ranges are 1-10 nm, preferably 3-8 nm. For III-V semiconductor compounds, suitable ranges are 1-8 nm, preferably 2-4 nm.

Second polymer: A wide range of polymers may be used. Suitable second polymers may be selected from the group consisting of acrylates, methacrylates, epoxies, and urethanes. The second polymer forms a matrix for the red light emitting core-shell quantum dots. The second polymer may, partly or in full, react with a polythiol (II), if present.

Polythiol: It was found that sulfur-containing compounds have a beneficial effect on the red light emitting layer. Specifically, edge ingress of that layer was improved (i.e. reduced) while maintaining the other beneficial optical properties. Depending on the nature of (II) and the second polymer, a chemical reaction between the both may take place. For example, if the second polymer is an acrylate, the polythiol (II) and the double bond of the acrylate monomer may form a thiol ether before or during the polymerization of the acrylate monomer. Thus, within the scope of the present invention red light emitting layers are comprising red QDs and second polymer as defined herein but no polythiol (II); or red QDs and second polymer and polythiol (II), each as defined herein;

red QDs and reaction product of second polymer+polythiol (II), each as defined herein;

red QDs and second polymer and polythiol (II) and reaction product of second polymer+polythiol (II), each as defined herein;

Red QDs and reaction product of second polymer+polythiol (II), each as defined herein;

Red QDs and second polymer and reaction product of second polymer+polythiol (II), each as defined herein.

Sulfur containing compounds are of the formula (II):

$$R^2(SH)_y, \qquad (II),$$

where $R^2$ is (hetero)hydrocarbyl group having a valence of y, and y is 2-20, preferably 2-10, e.g 4.

The thiol groups of the polythiols may be primary or secondary, preferably primary. The compounds of formula (II) may include a mixture of compounds having an average functionality of two or greater.

$R^2$ includes any hydrocarbyl groups, including aliphatic and aromatic polythiols with 2-50 carbon atoms.

$R^2$ includes (hetero)hydrocarbyl groups, ie. hydrocarboxy groups with 2-50 carbon atoms further comprising one or more functional groups. Functional groups include pendent hydroxyl, acid, ester, or cyano groups or catenary (in-chain) ether, urea, urethane and ester groups.

In one embodiment, $R^2$ comprises a non-polymeric aliphatic or cycloaliphatic moiety having from 2 to 30 carbon atoms.

Specific examples of useful polythiols include 2,3-dimercapto-1-propanol, 2-mercaptoethyl ether, 2-mercaptoethyl sulfide, 1,6-hexanedithiol, 1,8-octanedithiol, 1,8-dimercapto-3,6-dithiaoctane, propane-1,2,3-trithiol, and trithiocyanuric acid.

Another useful class of polythiols includes those obtained by esterification of a polyol with a terminally thiol-substituted carboxylic acid (or derivative thereof, such as esters or acyl halides) including α- or β-mercaptocarboxylic acids such as thioglycolic acid, β-mercaptopropionic acid, 2-mercaptobutyric acid, or esters thereof.

Useful examples of commercially available compounds thus obtained include ethylene glycol bis(thioglycolate), pentaerythritol tetrakis(3-mercaptopropionate), dipentaerythritol hexakis(3-mercaptopropionate), ethylene glycol bis(3-mercaptopropionate), trimethylolpropane tris(thioglycolate), trimethylolpropane tris(3-mercaptopropionate), pentaerythritol tetrakis (thioglycolate), pentaerythritol tetrakis (3-mercaptopropionate), pentaerithrytol tetrakis (3-mercaptobutylate), and 1,4-bis 3-mercaptobutylyloxy butane, tris[2-(3-mercapto-propionyloxy] ethyl]isocyanurate, trimethylolpropane tris (mercaptoacetate), 2,4-bis(mercaptomethyl)-1, 3, 5,-triazine-2, 4-dithiol, 2, 3-di(2-mercaptoethyl) thio)-1-propanethiol, dimercaptodiethylsufide, and ethoxylated trimethylpropantri(3-mercaptopropionate.

A specific example of a polymeric polythiol is polypropylene ether glycol bis(3-mercaptopropionate) which is prepared by esterification of polypropylene-ether glycol (e.g., Pluracol™ P201, BASF Wyandotte Chemical Corp.) and 3-mercaptopropionic acid by esterification.

Useful soluble, high molecular weight thiols include polyethylene glycol di(2-mercaptoacetate), LP-3™ resins supplied by Morton Thiokol Inc. (Trenton, N.J.), and Permapol P3™ resins supplied by Products Research & Chemical Corp. (Glendale, Calif.) and compounds such as the adduct of 2-mercaptoethylamine and caprolactam.

Preferred polythiols include the following pentaerythrol-derivatives (II-1) . . . (II-4):

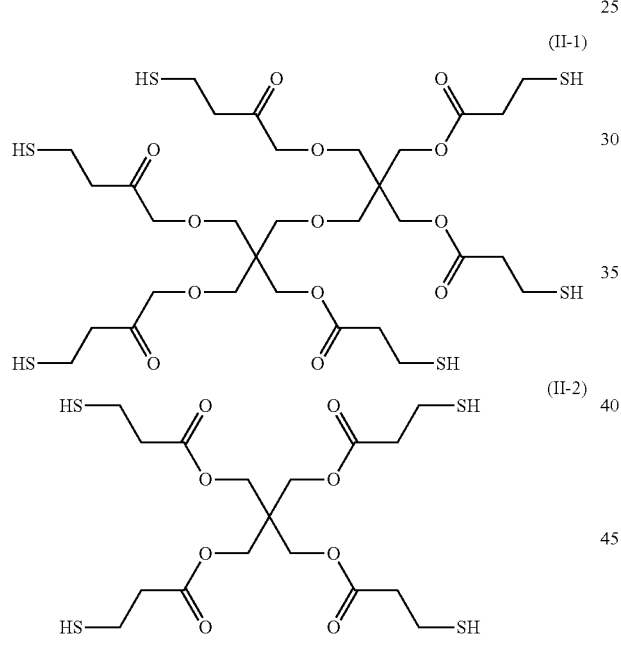

(II-1)

(II-2)

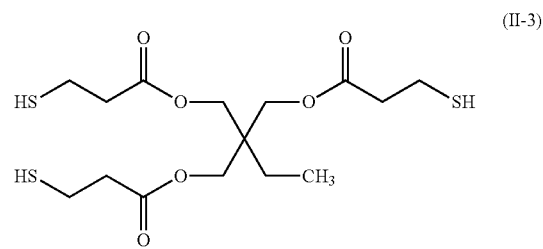

(II-3)

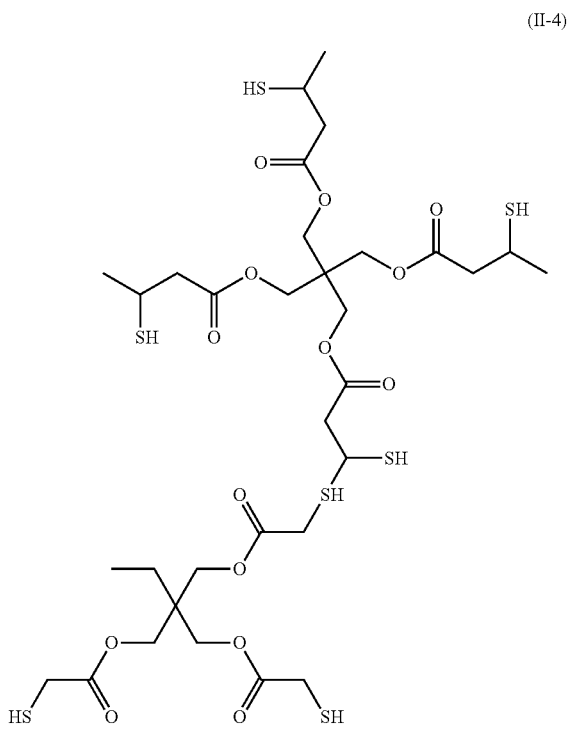

(II-4)

As discussed herein, this shall also include the corresponding reaction products with $2^{nd}$ polymer.

Preferred polythiols include the following isocyanurate-derivatives (II-5) . . . (II-7):

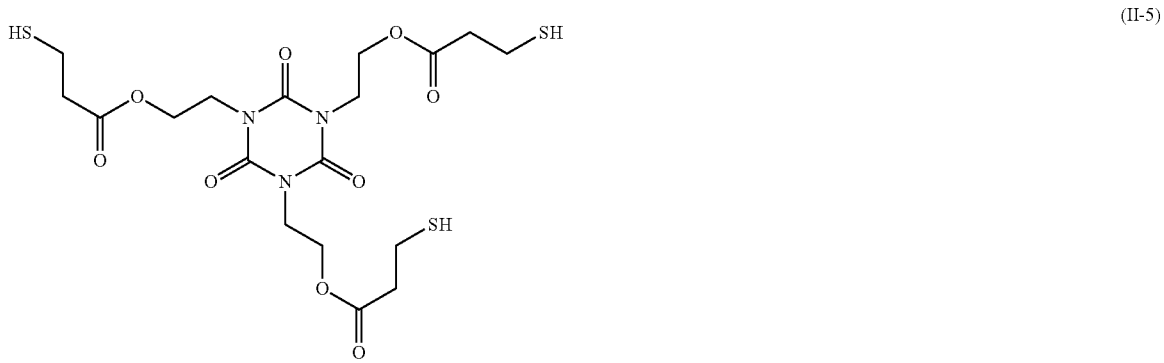

(II-5)

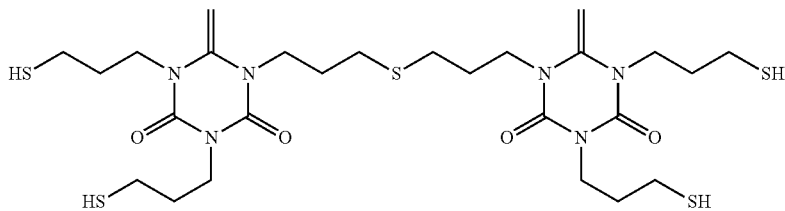

(II-6)

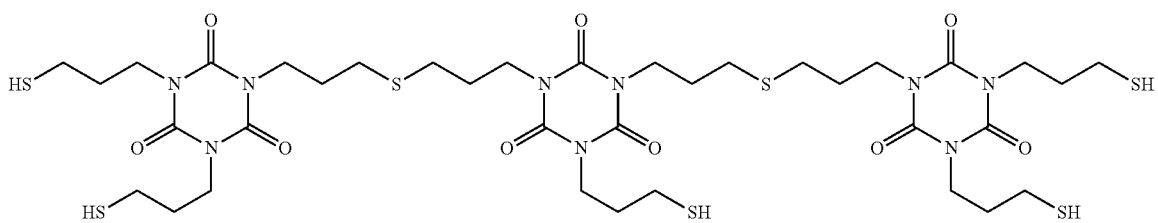

(II-7)

In the red light emitting polymer layer the sulfur-containing compound is either present with non-reacted thiol groups or with partially or fully reacted thiol groups being present as thio-ether groups. Such thio-ether groups may form when reacted for example with alkene-groups (e.g. acrylate monomers or vinyl monomers) after addition of the sulfur-containing compound (polythiol) to the liquid coating formulation of the red light emitting polymer layer or after UV-curing of the red light emitting polymer layer.

In a preferred embodiment the polythiol comprises 4 valences, i.e y=4, such as Pentaerythritol terakis(3-mercaptopropionate)(CAS 7575-23-7,).

In a preferred embodiment the polythiol comprises 4 valences, i.e y=4, such as Pentaerythritol terakis(3-mercaptopropionate) (CAS 7575-23-7,) and is present at a concentration of 20-50 wt % in the red light emitting polymer layer.

In an alternative embodiment, $R^2$ is polymeric and comprises a polyoxyalkylene, polyester, polyolefin, polyacrylate, or polysiloxane polymer having pendent or terminal reactive –SH groups. Useful polymers include, for example, thiol-terminated polyethylenes or polypropylenes, thiol-terminated poly(alkylene oxides) and thiol-terminated polyacrylates.

The amount of sulfur containing compound may vary over a broad range. Such amount may be determined in view of the amount of compound of formula (II) or in view of the sulfur content.

In embodiments, the amount of compound of formula (II) is 2-50 wt %, preferably 4-40 wt %, most preferably 10-30 wt % in the red light emitting polymer layer.

In embodiments, the sulfur concentration in the red light emitting polymer layer is in the range of 0.1-5 wt %, preferably 0.2-2.5 wt %, most preferably 0.5-1.5 wt %.

The inventive films may be manufactured using commercially available starting materials and laminating steps known to the skilled person. The examples provided below illustrate such manufacturing.

Advantageous Embodiments

Preferably, the luminescent crystals (perovskites and core-shell QDs) show a monodisperse size distribution. In the context of this invention, the term "monodisperse" refers to a population of quantum dots wherein at least about 60% of the population, preferably 75% to 90% of the population, or any integer or noninteger there between, falls within a specified particle size range. A population of monodispersed particles deviates less than 20% root-mean-square (rms) in diameter, more preferably less than 10% rms, and most preferably, less than 5% rms. Particle size and particle size distribution may be determined by microscopy.

In a further advantageous embodiment of the invention, the concentration of $M^2$ in the green emitting polymer layer is 100-1000 ppm preferably 300-1000 ppm, most preferably 500-1000 ppm and/or the concentration of $M^3+M^{3'}$ in the red emitting polymer layer is >300 ppm, preferably >600 ppm, most preferably >1'200 ppm.

In a further advantageous embodiment the red core-shell quantum dots have a platelet structure and/or the green perovskite crystals have a cubic structure.

In a further advantageous embodiment of the invention, the red core-shell quantum dots have a particular size $s_p$ of 1 nm≤$s_p$≤10 nm, in particular 3mn≤$s_p$≤8 nm, in particular 2 nm≤$s_p$≤6 nm, in particular 2 nm≤$s_p$≤4 nm.

In another advantageous embodiment, the green emitting polymer has a molar ratio of the sum of (oxygen+nitrogen+sulfur+phosphorous) to carbon z, wherein z≤0.9, z≤0.75 in particular z≤0.4, in particular z≤0.3, in particular z≤0.25. The z value is an indicator for polarity of a polymer. Values of z≤0.3 indicate nonpolar polymers. It was found that the polymer polarity influences film performance and a lower polarity for the polymer of the green light emitting film improves performance. Preferably, the z value of the polymer in the green light emitting layer $z_{green}$ is below the z value of the polymer in the red light emitting layer $z_{red}$. Preferably, $z_{green}:z_{red}$<1:2; more preferably $z_{green}:z_{red}$<1:5.

In another advantageous embodiment, the first polymer and/or the second polymer comprises acrylates or methacrylates, particularly wherein the first and/or second polymer comprises a polycyclic acrylate or methacrylate.

Suitable polymers for light emitting layers ("first polymer" and "second polymer") are known and commercially available. Preferred are UV curable acrylates or methacrylates with high transparency. Such materials are described e.g. in EP3753994B1 (as polymer P1 in section [0039-0056]) which is incorporated by reference.

In an advantageous embodiment the first and/or second polymer comprises an acrylate selected from the list of isobornylacrylate (CAS 5888-33-5), isobornylmethacrylate (CAS 7534-94-3), dicyclopentanyl-acrylate (CAS 79637-

74-4, FA-513AS (Hitachi Chemical, Japan)), dicyclopentanyl-methacrylate (CAS 34759-34-7, FA-513M (Hitachi Chemical, Japan)), 3,3,5-trimethyl cyclohexyl acrylate (CAS 86178-38-3), 3,3,5-trimethyl cyclohexyl methacrylate (CAS 7779-31-9), 4-tert-butylcyclohexyl acrylate (CAS 84100-23-2), 4-tert-Butylcyclohexyl methacrylate (CAS 46729-07-1).

In another advantageous embodiment, the polymer of the green and/or red light emitting polymer layer is crosslinked.

In another advantageous embodiment, the polymer of the green and/or red emitting polymer layer ("first polymer" and "second polymer") comprises a multi-functional acrylate.

Architecture:

The inventive films may be implemented in a number of different architectures.

In a first embodiment, inventive films comprise in addition to the red and green light emitting polymer layers, one first inorganic barrier film, one second inorganic barrier film and one or more separating layers. It is understood that one or more additional layers, such as intermediate layer, adhesive layers or other non-emissive polymer layers, may be present.

In a second embodiment, inventive films comprise in addition to the red and green light emitting polymer layers one first inorganic barrier film, one second inorganic barrier film and two inorganic separating layers between the light emitting layers. Again, it is understood that one or more additional layers, such as intermediate layers, adhesive layers or other non-emissive polymer layers, may be present.

In a second embodiment, inventive films comprise in addition to the red and green light emitting polymer layers one first inorganic barrier film, one second inorganic barrier film and two organic separating layers between the light emitting layers. Again, it is understood that one or more additional layers, such as intermediate layers, adhesive layers or other non-emissive polymer layers, may be present.

In a third embodiment, inventive films comprise a multitude of layers whereby between one or more inorganic layers and green and red light emitting polymer layers there is an intermediate layer. In this embodiment, a direct contact of light emitting polymer layer and inorganic separation/barrier layer is avoided by introducing one or more non-emissive polymer layer(s), such as intermediate layers.

In a further embodiment, inventive films comprise the following layer sequence: green emitting polymer layer/separating layer/red emitting polymer layer.

In a further embodiment, inventive films comprise the following layer sequence: intermediate layer/green emitting polymer layer/separating layer/red emitting polymer layer.

In a further embodiment, inventive films comprise the following layer sequence: intermediate layer/green emitting polymer layer/intermediate layer/separating layer/red emitting polymer layer.

In a further embodiment, inventive films comprise the following layer sequence: intermediate layer/green emitting polymer layer/PET separating layer/red emitting polymer layer.

In a further embodiment, inventive films comprise the following layer sequence: intermediate layer/green emitting polymer layer/PET separating layer/adhesive layer/PET separating layer/red emitting polymer layer/.

In a further embodiment, inventive films comprise the following layer sequence: red emitting polymer layer/separating layer/green emitting polymer layer/separating layer/red emitting polymer layer.

In a further embodiment, inventive films comprise the following layer sequence: green emitting polymer layer/separating layer/red emitting polymer layer/separating layer/green emitting polymer layer.

In a further embodiment, inventive films comprise the following layer sequence: green emitting polymer layer/separating layer/red emitting polymer layer/dichroic mirror film (blue light pass filter film).

EXAMPLES

Example 1: Preparation of a Color Conversion Film According to the present invention with an inorganic separating layer between the green emitting polymer layer and the red emitting polymer layer.

Formation of green ink: Green perovskite luminescent crystals with composition formamidinium lead tribromide ($FAPbBr_3$) are synthesized in toluene as following: Formamidinium lead tribromide ($FAPbBr_3$) was synthesized by milling $PbBr_2$ and FABr. Namely, 16 mmol $PbBr_2$ (5.87 g, 98% ABCR, Karlsruhe (DE)) and 16 mmol FABr (2.00 g, Greatcell Solar Materials, Queanbeyan, (AU)) were milled with Yttrium stabilized zirconia beads (5 mm diameter) for 6 h to obtain pure cubic $FAPbBr_3$, confirmed by XRD. The orange $FAPbBr_3$ powder was added to Oleylamine (80-90, Acros Organics, Geel (BE)) (weight ratio $FAPbBr_3$:Oleylamine=100:15) and toluene (>99.5%, puriss, Sigma Aldrich). The final concentration of $FAPbBr_3$ was 1 wt %. The mixture was then dispersed by ball milling using yttrium stabilized zirconia beads with a diameter size of 200 μm at ambient conditions (if not otherwise defined, the atmospheric conditions for all experiments are: 35° C., 1 atm, in air) for a period of 1 h yielding an ink with green luminescence.

Formation of green emitting polymer layer: 0.1 g of the green ink was mixed with an UV curable monomer/crosslinker mixture (0.7 g FA-513AS, Hitachi Chemical, Japan/ 0.3 g Miramer M240, Miwon, Korea) containing 1 wt % photoinitiator Diphenyl(2,4,6-trimethylbenzoyl) phosphine oxide (TCI Europe, Netherlands) and 2 wt % polymeric scattering particles (Organopolysiloxane, ShinEtsu, KMP-590) in a speed mixer and the toluene was evaporated by vacuum (<0.01 mbar) at room temperature. The resulting mixture was then coated with 50 micron layer thickness on a 25 micron barrier film (supplier: I-components (Korea); SiOx layer on PET substrate) on the side of the inorganic layer, then laminated with a second barrier film of the same type whereby the side of the inorganic layer was adjacent the green emitting polymer layer. Afterwards the laminate structure was UV-cured for 60 s (UVAcube100 equipped with a mercury lamp and quartz filter, Hoenle, Germany). The initial performance of the as obtained film showed a green emission wavelength of 526 nm with a FWHM of 22 nm.

Formation of red emitting polymer layer: 0.1 g red luminescent crystals being isometric core-shell QDs having an InP core and a ZnS shell (1 wt % suspended in toluene) were mixed with an UV curable monomer/crosslinker mixture (0.5 g FA-DCPA, Hitachi Chemical, Japan/0.5 g Miramer M2372, Miwon, Korea) containing 1 wt % photoinitiator Diphenyl(2,4,6-trimethylbenzoyl) phosphine oxide (TCI Europe, Netherlands) and 2 wt % polymeric scattering particles (Organopolysiloxane, ShinEtsu, KMP-590) in a speed mixer and the toluene was evaporated by vacuum (<0.01 mbar) at room temperature. The resulting mixture was then coated with 50 micron layer thickness on the PET side of a barrier film of the green emitting film, then laminated with a barrier film of the same type as used before whereby the side of the inorganic layer was adjacent the red emitting polymer layer. Afterwards the laminate structure was UV-cured for 60 s (UVAcube100 equipped with a mercury lamp and quartz filter, Hoenle, Germany). The initial performance of the as obtained film showed a red emission wavelength of 630 nm with a FWHM of 45 nm.

The thus obtained color conversion film of example 1 comprises an inorganic separating layer which is the SiOx layer on the PET/SiOx barrier film used between the green emitting polymer and the red emitting polymer layer.

The stability of the color conversion film of example 1 was tested for 1'000 hours of a cut piece of color conversion film as prepared above in a climate chamber with 60° C. and 90% relative humidity. Then the so-called edge ingress was measured for the green and red emitting polymer layer (edge ingress means dead edge as resulting from degraded perovskite crystals and/or core-shell quantum dots by oxygen and/or humidity diffusion starting from the film edge towards the film centre.

Edge ingress result after 1'000h under 60° C./90% r.H:
Green edge ingress: 0.7 mm
Red edge ingress: 0.5 mm These results show that a color conversion film could be obtained whereby the green emitting polymer layer and red emitting polymer layer both show a good resistance to edge ingress under high-temperature/high-humidity. The green and red emission wavelength after high-temperature/high-humidity testing stayed constant.

Example 2: Preparation of a color conversion film according to the present invention with an organic separating layer between the green emitting polymer layer and the red emitting polymer layer.

Formation of green ink: Same procedure as in example 1.

Formation of green emitting polymer layer: 0.1 g of the green ink was mixed with an UV curable monomer/crosslinker mixture (0.7 g FA-513AS, Hitachi Chemical, Japan/0.3 g Miramer M240, Miwon, Korea) containing 1 wt % photoinitiator Diphenyl(2,4,6-trimethylbenzoyl) phosphine oxide (TCI Europe, Netherlands) and 2 wt % polymeric scattering particles (Organopolysiloxane, ShinEtsu, KMP-590) in a speed mixer and the toluene was evaporated by vacuum (<0.01 mbar) at room temperature. The resulting mixture was then coated with 50 micron layer thickness on a 25 micron barrier film (supplier: I-components (Korea); SiOx layer on PET substrate) on the side of the inorganic layer, then laminated with a 50 micron PET film (this PET film will finally be the organic separating layer). Afterwards the laminate structure was UV-cured for 60 s (UVAcube100 equipped with a mercury lamp and quartz filter, Hoenle, Germany). The initial performance of the as obtained film showed a green emission wavelength of 526 nm with a FWHM of 22 nm.

Formation of red emitting polymer layer: 0.1 g red luminescent crystals being isometric core-shell QDs having an InP core and a ZnS shell (1 wt % suspended in toluene) were mixed with an UV curable monomer/crosslinker mixture (0.5 g FA-DCPA, Hitachi Chemical, Japan/0.5 g Miramer M2372, Miwon, Korea) containing 1 wt % photoinitiator Diphenyl(2,4,6-trimethylbenzoyl) phosphine oxide (TCI Europe, Netherlands) and 2 wt % polymeric scattering particles (Organopolysiloxane, ShinEtsu, KMP-590) in a speed mixer and the toluene was evaporated by vacuum (<0.01 mbar) at room temperature. The resulting mixture was then coated with 50 micron layer thickness on the PET film of the green emitting film, then laminated with a barrier film of the same type as used before whereby the side of the inorganic layer was adjacent the red emitting polymer layer. Afterwards the laminate structure was UV-cured for 60 s (UVAcube100 equipped with a mercury lamp and quartz filter, Hoenle, Germany). The initial performance of the as obtained film showed a red emission wavelength of 630 nm with a FWHM of nm.

The stability of the film according to example 2 was tested for 1'000 hours of a cut piece of color conversion film as prepared above in a climate chamber with 60° C. and 90% relative humidity. Then the so-called edge ingress was measured for the green and red emitting polymer layer (edge ingress means dead edge as resulting from degraded perovskite crystals and/or core-shell quantum dots by oxygen and/or humidity diffusion starting from the film edge towards the film centre.

Edge ingress result after 1'000h under 60° C./90% r.H:
Green edge ingress: 0.7 mm
Red edge ingress: 0.6 mm These results show that a color conversion film could be obtained whereby the green emitting polymer layer and red emitting polymer layer both show a good resistance to edge ingress under high-temperature/high-humidity. The green and red emission wavelength after high-temperature/high-humidity testing stayed constant.

Example 3: Preparation of a color conversion film according to the present invention with an organic separating layer between the green emitting polymer layer and the red emitting polymer layer and a sulfur-containing compound in the red emitting polymer layer.

Formation of green ink: Same procedure as in example 1.

Formation of green emitting polymer layer: Same as in example 2.

Formation of red emitting polymer layer: 0.1 g red luminescent crystals being isometric core-shell QDs having an InP core and a ZnS shell (1 wt % suspended in toluene) were mixed with an UV curable monomer/crosslinker mixture (0.5 g FA-DCPA, Hitachi Chemical, Japan/0.5 g Miramer M2372, Miwon, Korea) containing 25 wt % Pentaerythritol terakis(3-mercaptopropionate) from Sigma-Aldrich (CAS 7575-23-7) and 1 wt % photoinitiator Diphenyl (2,4,6-trimethylbenzoyl) phosphine oxide (TCI Europe, Netherlands) and 2 wt % polymeric scattering particles (Organopolysiloxane, ShinEtsu, KMP-590) in a speed mixer and the toluene was evaporated by vacuum (<0.01 mbar) at room temperature. The resulting mixture was then coated with 50 micron layer thickness on the PET film of the green emitting film, then laminated with a barrier film of the same type as used before whereby the side of the inorganic layer was adjacent the red emitting polymer layer. Afterwards the laminate structure was UV-cured for 60 s (UVAcube100 equipped with a mercury lamp and quartz filter, Hoenle, Germany). The initial performance of the as obtained film showed a red emission wavelength of 630 nm with a FWHM of 45 nm.

The stability of the film was tested for 1'000 hours of a cut piece of color conversion film as prepared above in a climate chamber with 60° C. and 90% relative humidity. Then the so-called edge ingress was measured for the green and red emitting polymer layer (edge ingress means dead edge as resulting from degraded perovskite crystals and/or core-shell quantum dots by oxygen and/or humidity diffusion starting from the film edge towards the film centre.

Edge ingress result after 1'000h under 60° C./90% r.H:
Green edge ingress: 0.7 mm
Red edge ingress: 0.3 mm These results show that a color conversion film could be obtained whereby the green emitting polymer layer and red emitting polymer layer both show a good resistance to edge ingress under high-temperature/high-humidity. The green and red emission wavelength after high-temperature/high-humidity testing stayed constant. The addition of the sulfur-containing compound further improved the red edge ingress compared to example 2.

Comparative example 1: Preparation of a color conversion film without a separating layer between the green emitting polymer layer and the red emitting polymer layer.

The procedure was the same as in the previous procedure in example 1, except the following steps were adapted:
  The green emitting polymer layer was laminated only with one barrier film. The second film for lamination was a PET film.
  After UV curing of the green emitting polymer layer the PET film was removed from the sandwich structure.
  Then the red emitting polymer layer was formed directly on the green emitting polymer layer and subsequently laminated with a barrier film before UV curing of the red layer.

The green and red emission wavelength and FWHM were the same as in experiment 1.

The stability of the film was tested for 1'000 hours of a cut piece of quantum dot color conversion film as prepared above in a climate chamber with 60° C. and 90% relative humidity. Then the edge ingress was measured for the green and red emitting polymer layer.

Edge ingress result alter 1'000h under 60° C./90% r.H:
  Green edge ingress: 0.7 mm
  Red edge ingress: 2.0 mm These results show that a color conversion film without a separating layer between the green emitting polymer layer and red emitting polymer layer results in a large edge ingress in the red emitting polymer layer.

The invention claimed is:

1. A color conversion film which, upon excitation by blue light, emits green and red light; the film comprising a multitude of layers whereby, at least one layer is a green light emitting layer comprising green light emitting perovskite crystals embedded in a matrix comprising a first polymer; and at least one layer is a red light emitting polymer layer comprising red light emitting core-shell quantum dots selected from the group of II-VI semiconductor compounds and III-V semiconductor compounds and embedded in a matrix comprising a second polymer; and at least one layer is a separating layer, separating said at least one red light emitting polymer layer from said at least one green light emitting polymer layer; characterized in that said separating layer is a continuous layer covering the whole area between green light and red light emitting polymer layer; and characterized in that said separating layer contains a third polymer.

2. The color conversion film of claim 1, characterized in that said separating layer provides properties of an oxygen barrier, preferably where the oxygen transmission rate (determined by ISO15105 at 23° C./90% r.h./atmospheric pressure) of said separating layer is <100 cm$^3$/m$^2$*d.

3. The color conversion film according to claim 1, wherein the third polymer is selected from the group of polyesters and poly-ethylene-vinyl-alcohols; and/or the third polymer comprises a sulfur containing compound.

4. The color conversion film according to claim 1, wherein the red light emitting polymer layer additionally comprises a sulfur-containing compound as defined in formula (II) and/or its reaction product with monomers of the second polymer: $R^2(SH)y$, (II) where $R^2$ represents a hydrocarbyl group with 2-50 carbon atoms and having a valence of 2 20, or a heterohydrocarbyl group with 2-50 carbon atoms further comprising 1 or more functional groups and having a valence of 2-20, and y is 2-20; and each thiol group in formula (II) may be primary or secondary.

5. The color conversion film according to claim 4, wherein
  the sulfur-containing compound is present as non-reacted polythiol according to formula (II), or
  the sulfur containing compound is present in the form of a thioether, thereby forming covalent bonds to the second polymer, or
  a mixture thereof.

6. The color conversion film according to claim 4, wherein y represents 4.

7. The color conversion film according to claim 4, wherein
  the concentration of the sulfur-containing compound in the red light emitting polymer layer is 2-50 wt %; and/or
  the sulfur concentration in the red light emitting polymer layer is 0.1-5 wt %.

8. The color conversion film according to claim 1, wherein the second polymer is less polar than the first polymer, whereby the ratio of polarity is indicated by $z_{green}:z_{red}<1:2$; and whereby z is determined by molar ratio of the sum of (oxygen, nitrogen, sulfur and phosphorus) to carbon.

9. The color conversion film according to claim 1, wherein the first polymer is selected from the group of acrylates or methacrylates; and/or the second polymer is selected from the group of acrylates or methacrylates; and/or the third polymer is selected from the group of polyesters or poly-ethylene-vinyl-alcohols.

10. The color conversion film according to claim 1, wherein
  the perovskite crystals are selected from Formamidinium lead bromide (FAPbBr$_3$); and/or
  the core-shell quantum dots are selected from core-shell quantum dots comprising Indium.

11. The color conversion film according to claim 1, having a total film thickness of 10-500 micrometers.

12. The color conversion film according to claim 1 with the layer sequence:
  green emitting polymer layer/separating layer/red emitting polymer layer; or
  intermediate layer/green emitting polymer layer/separating layer/red emitting polymer layer; or
  intermediate layer/green emitting polymer layer/intermediate layer/separating layer/red emitting polymer layer; or
  intermediate layer/green emitting polymer layer/PET separating layer/red emitting polymer layer; or
  intermediate layer/green emitting polymer layer/PET separating layer/adhesive layer/PET separating layer/red emitting polymer layer.

13. A display backlight component comprising a color conversion film according to claim 1.

14. A light emitting device, preferably a Liquid Crystal Display, comprising a color conversion film according to claim 1.

15. The color conversion film according to claim 4, wherein
  the perovskite crystals are selected from Formamidinium lead bromide (FAPbBr$_3$); and/or
  the core-shell quantum dots are selected from core-shell quantum dots comprising Indium.

16. The color conversion film according to claim 4, having a total film thickness of 10-500 micrometers.

17. A display backlight component comprising a color conversion film according to claim 4.

18. A light emitting device, preferably a Liquid Crystal Display, comprising a color conversion film according to claim 4.

* * * * *